US007589652B2

(12) United States Patent
Lee et al.

(10) Patent No.: US 7,589,652 B2
(45) Date of Patent: Sep. 15, 2009

(54) READ AND WRITE INTERFACE COMMUNICATIONS PROTOCOL FOR DIGITAL-TO-ANALOG SIGNAL CONVERTER WITH NON-VOLATILE MEMORY

(75) Inventors: Thomas Youbok Lee, Chandler, AZ (US); Jonathan Jackson, Chandler, AZ (US); John Austin, Queen Creek, AZ (US); Andrew Swaneck, Queen Creek, AZ (US); Yann Johner, Preverenges (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/017,582

(22) Filed: Jan. 22, 2008

(65) Prior Publication Data

US 2008/0252505 A1 Oct. 16, 2008

Related U.S. Application Data

(60) Provisional application No. 60/911,287, filed on Apr. 12, 2007.

(51) Int. Cl.
*H03M 1/66* (2006.01)

(52) U.S. Cl. ...................................... 341/144; 341/141

(58) Field of Classification Search ................ 341/141, 341/144
See application file for complete search history.

(56) References Cited

U.S. PATENT DOCUMENTS 6,466,149 B2 * 10/2002 Tabler ........................ 341/144
6,765,954 B1 7/2004 Eichrodt et al.
6,823,416 B1 * 11/2004 Dempsey et al. ............ 710/305
6,985,100 B2 * 1/2006 Geraghty et al. ............ 341/141

OTHER PUBLICATIONS

International Search Report and Written Opinion dated Oct. 9, 2008, for PCT/US2008/059918.

Intersil Americas Inc., NV DAC with Selectable Output Range and Memory, Mar. 17, 2005, pp. 1-18, XP002497504; retrieved from the internet: URL:http://www.intersil.com/data/fn/fn8147.pdf.

Analog Devices: Dual Low Power CMOS Analog Front End with DSP Microcomputer, Mar. 2006, pp. 1-32, XP002497505, retrieved from the Internet: URL:http://www.analog.com.

Deno S et al.: A Low Cost Microcontroller Compensated Crystal Oscillator: IEEE International Frequency Control Symposium, 1997, pp. 954-960; XP002497506.

* cited by examiner

*Primary Examiner*—Khai M Nguyen
(74) *Attorney, Agent, or Firm*—King & Spalding LLP

(57) ABSTRACT

A mixed signal device, e.g., digital-to-analog converter (DAC) device has a serial interface communication protocol that accesses volatile and/or nonvolatile memory and allows a preprogrammed output voltage whenever the mixed signal device is powered-up. However, unlike conventional DAC devices, DAC devices with non-volatile memory may need special interface communication protocols for effective operation of the DAC device and communications between a system master controller unit (MCU). Interface communications protocols that do not violate standard serial bus communications protocols are provided for communicating between the volatile and non-volatile memories of the DAC device so that the MCU may access the DAC device's memories (non-volatile and/or volatile memories).

18 Claims, 17 Drawing Sheets

| C2 | C1 | C0 | Command Name | Function |
|---|---|---|---|---|
| 0 | 0 | 0 | Fast Write | Changes power-down select bits and DAC codes. Data sent sequentially for each DAC register. Non-volatile memory not affected. |
| 0 | 0 | 1 | Fast Write | Changes power-down select bits and DAC codes. Data sent sequentially for each DAC register. Non-volatile memory not affected. |
| 0 | 1 | 0 | Write DAC Input Registers | Loads configuration bits and data code to the DAC input register |
| 0 | 1 | 1 | Write DAC Input Register and Non-Volatile Memory | Loads configuration bits and data code to the DAC input register and writes to non-volatile memory. |
| 1 | 0 | 0 | Write Vref in Input Registers | Changes Vref select bit. Only DAC register affected, no change to non-volatile memory. |
| 1 | 0 | 1 | Write Power-Down Bits in Input Registers | Changes power-down select bits. Only DAC register affected, no change to non-volatile memory. |
| 1 | 1 | 0 | Write Lock Bit | Writes lock bit in non-volatile memory for device address and trim bits. |
| 1 | 1 | 1 | Write Address and Trim Bits | Writes trim bits in non-volatile memory. |

FIGURE 3

READ AND WRITE INTERFACE COMMUNICATIONS PROTOCOL FOR DIGITAL-TO-ANALOG SIGNAL CONVERTER WITH NON-VOLATILE MEMORY

RELATED PATENT APPLICATION

This application claims priority to commonly owned U.S. Provisional Patent Application Ser. No. 60/911,287; filed Apr. 12, 2007; entitled "Read and Write Interface Communications Protocol for Digital-to-Analog Signal Converter with Non-Volatile Memory," by Thomas Youbok Lee, Jonathan Jackson, John Austin, Andrew Swaneck and Yann Johner; which is hereby incorporated by reference herein for all purposes.

TECHNICAL FIELD

The present disclosure relates to digital-to-analog converters (DACs), and, more particularly to, communications protocols used for DACs that store configuration information and input data in non-volatile memory.

BACKGROUND

Present technology DAC devices store configuration information and input data in volatile memory. The configuration information and input data stored in the volatile memory are lost when operating power is removed from the DAC device and the associated volatile memory. For example, a DAC device may be used to output a programmable analog voltage. The programming bits, e.g., digital representation of the analog voltage, are stored in a DAC register which is volatile, thereby loosing its contents when powered down. Upon an initial power-up of the DAC device, the DAC register is either cleared or its contents are not predictable until the DAC register is programmed again. Thus the DAC register must be reprogrammed each time the DAC device is powered up. This necessitates additional program cycles of a master controller program so as to reprogram the DAC register. In many applications, DAC devices support operation of other devices in a system. For example, the DAC device may provide a reference voltage to other devices for proper operation thereof. Since the DAC register has to be reprogrammed, all other devices dependent upon the DAC device must wait (prevented from operating) until the DAC register contains the correct data.

SUMMARY

Therefore there is a need to prevent loss of the DAC device configuration information and input data during a power down or power loss condition. If the DAC device outputs a preprogrammed output by itself immediately when it turns-on, then the overall system application reduces several initialization and calibration steps, and can thereby initialize the system with the same conditions all the time, even when there are power interruptions thereto. This will increase system operating efficiency and the useful range of applications.

A DAC device may have both volatile and non-volatile internal memory blocks. The non-volatile memory may be used to store configuration information and digital voltage values, e.g, data, for the DAC device. The non-volatile memory may be for example, but is not limited to, electrically erasable and programmable read only memory (EEPROM), FLASH memory and the like. This data may be written into the internal non-volatile memory block at any time, and the stored configuration information and digital voltage values may thereby be protected from being lost during a power outage.

According to the teachings of this disclosure, a non-volatile memory, e.g. EEPROM, FLASH, etc., may be part of the DAC device. The DAC/non-volatile memory device may thereby provide a preprogrammed output voltage whenever it is powered-up. However, unlike the conventional DAC devices, DAC devices with the non-volatile memory may need special interface communication protocols for effective operation of the DAC device. For example, the system master controller unit (MCU) requires a way to access the volatile memory (DAC register) and/or the non-volatile memory (e.g., EEPROM). Therefore, the non-volatile memory in the DAC device requires effective interface communication protocols with the MCU so that the MCU may access the DAC device's memories (both non-volatile and volatile memories) effectively. Since most of the mixed signal devices such as DAC, analog-to-digital (ADC), and digital potentiometer are operated by using a standard serial interface, e.g., $I^2C$, SPI, USB, SCIO, etc., the interface communication protocols for communicating with the volatile and non-volatile memories of the DAC device may operate without violating the specifications of the existing serial communications protocols.

According to teachings of this disclosure, a serial data interface communication protocol may be used to operate the DAC device and the internal non-volatile memory over a serial data bus, e.g., $I^2C$, SPI, USB, SCIO, etc. For example, but not limited to, one, two, three or four channel 12 bit DAC devices with non-volatile memory, wherein these DAC devices may incorporate the same non-volatile interface communication protocol. Using an interface communication protocol solves the following problems: (a) A user may read and/or write the configuration and data information into non-volatile or volatile memories with a simple command(s). This also reduces the interface communication time. (b) A simple and yet effective command structure reduces the complexity of device interface circuits. And (c) the same command structure may be used for reading from and writing to device test registers using the same integrated circuit package pin-out connections, thus eliminating the need for extra test interfaces.

According to a specific example embodiment of this disclosure, a device for digital-to-analog conversion and having non-volatile memory for storage of configuration information and digital values for conversion to analog values comprises: a serial input-output port adapted for coupling to a serial bus; a serial interface and logic, the serial interface coupled to the serial input-output port; one or more input registers coupled to the serial interface and logic; one or more digital-to-analog converter registers coupled to respective ones of the one or more input registers; one or more digital-to-analog converters coupled to respective ones of the one or more digital-to-analog converter registers; and at least one non-volatile memory coupled to the one or more input registers.

BRIEF DESCRIPTION OF THE DRAWINGS

A more complete understanding of the present disclosure may be acquired by referring to the following description taken in conjunction with the accompanying drawings wherein:

FIG. 3 illustrates a table of write commands used for address, command and data protocol structures, according to specific example embodiments of this disclosure;

Figure 1:
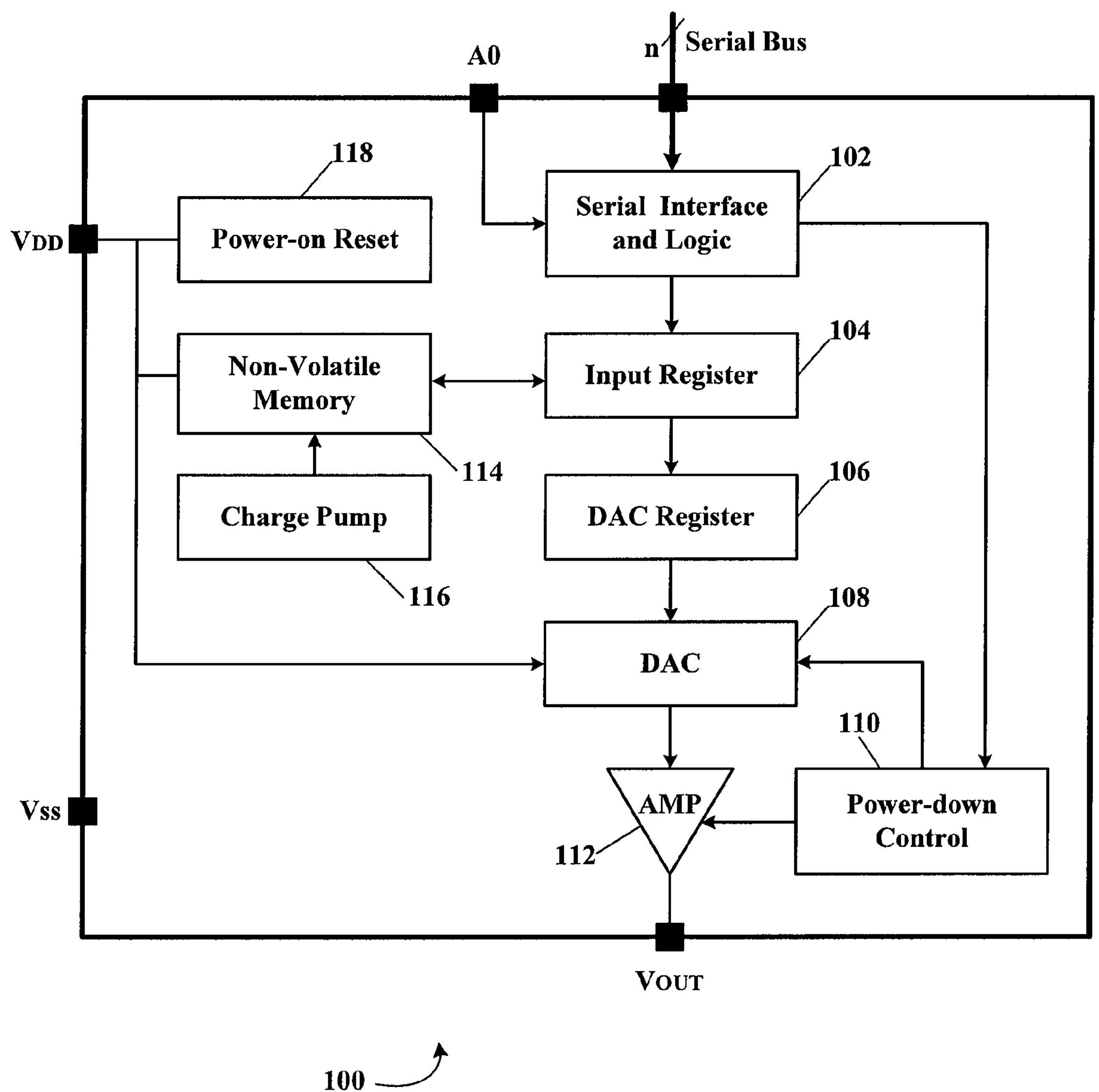
FIG. 1 illustrates a schematic block diagram of a device having a single channel digital-to-analog conversion (DAC) capability and non-volatile memory, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a device having a single digital-to-analog conversion (DAC) capability and non-volatile memory, according to a specific example embodiment of this disclosure. The device, generally represented by the numeral 100, may comprise a serial interface and logic 102, an input register 104, a DAC register 106, a digital-to-analog converter (DAC) 108, power-down control 110, an analog amplifier 112, a non-volatile memory 114, a charge pump 116, and a power-on-reset (POR) circuit 118.

The non-volatile memory 114 may be, but is not limited to, an electrically erasable and programmable read only memory (EEPROM), FLASH memory, etc. For example, a 14 bit EEPROM may be used to store configuration register bits (e.g., 2 bits) and DAC input data (e.g., 12 bits of a digital representation of the analog voltage the DAC 108 is supposed to produce). The charge pump 116 may be used for writing to the non-volatile memory 114. Power may be supplied to the device 100 at voltage terminals $V_{DD}$ and $V_{SS}$. The input register 104 may have an address select line at node A0 for selection from a number of devices. The serial interface and logic 102 is coupled to a serial data bus of n-bit width, e.g., n=1, 2, 3, etc. Configuration and data values may be written to or read from the non-volatile memory 114 and/or the input register 104. The DAC register 106 may be loaded from the input register 104. Also the contents of the non-volatile memory 114 may be transferred to the input register 104.

Figure 2:
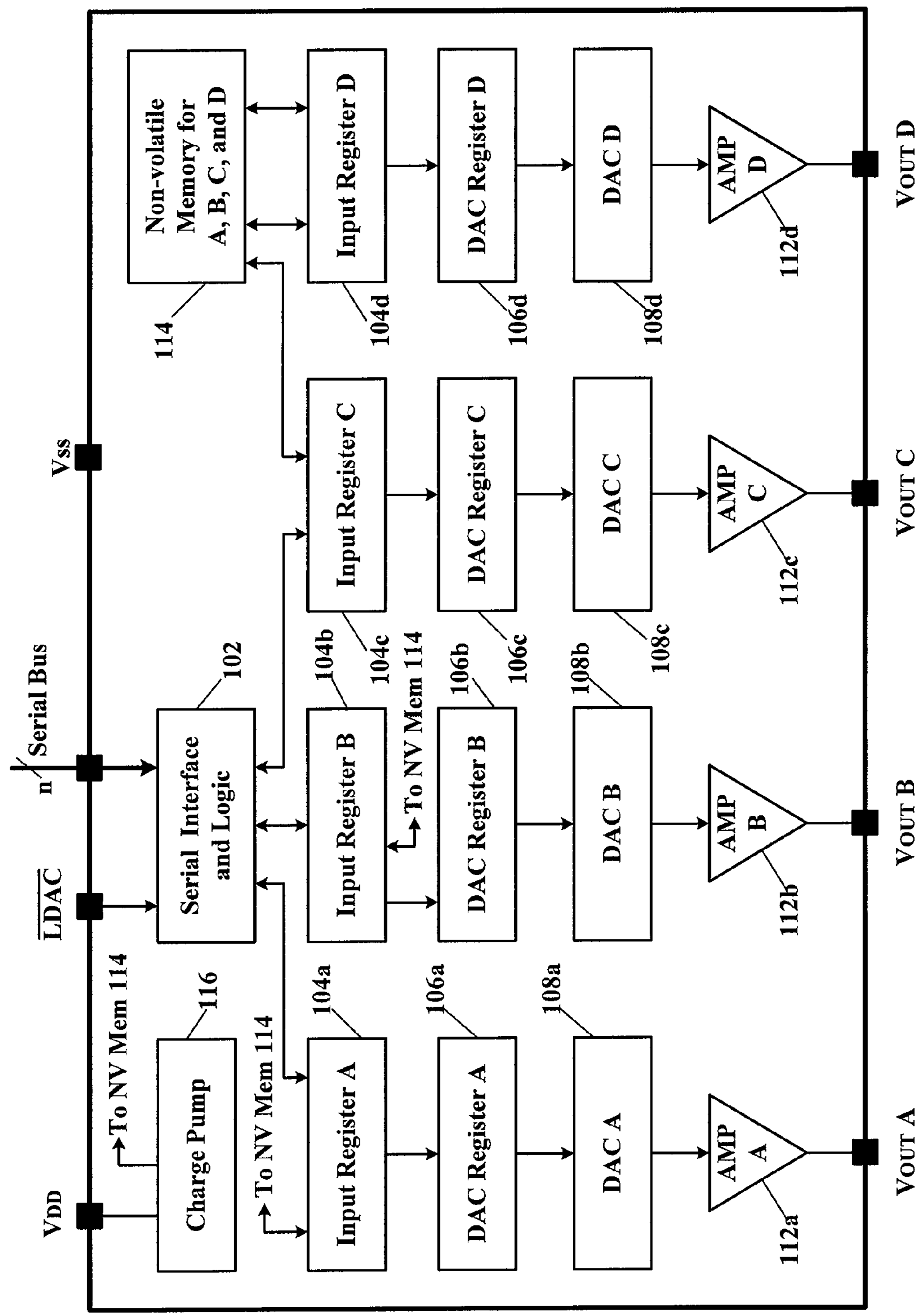
FIG. 2 illustrates a schematic block diagram of a device having multiple channels of digital-to-analog conversion (DAC) capabilities and non-volatile memories, according to another specific example embodiment of this disclosure.

Referring to FIG. 2, depicted is a schematic block diagram of a device having multiple channels of digital-to-analog conversion capabilities and non-volatile memories, according to another specific example embodiment of this disclosure. The device, generally represented by the numeral 200, may comprise a serial interface and logic 102, a plurality of input registers 104, a plurality of DAC registers 106, a plurality of digital-to-analog converters (DAC) 108, a plurality of analog amplifiers 112, a non-volatile memory 114, and a charge pump 116. Power-on-reset (POR) circuit 118 (FIG. 1), power-down control 110 (FIG. 1), an internal voltage reference and voltage reference value selection circuit are not shown but may also be part of the devices 100 and/or 200. Four ADC channels are shown but it is contemplated and within the scope of this disclosure that any number of ADC channels may be utilized in combination with the teachings of this disclosure.

The non-volatile memory 114 may be, but is not limited to, electrically erasable and programmable read only memory (EEPROM), FLASH memory, etc. For example, an EEPROM organized in 14 bit words may be used to store configuration register bits (e.g., 2 bits) and DAC input data (e.g., 12 bits of a digital representation of the analog voltage of the respective DAC 108 is supposed to produce). The charge pump 116 may be used for writing to the non-volatile memory 114. Power may be supplied to the device 100 at voltage terminals $V_{DD}$ and $V_{SS}$. The serial interface and logic 102 may have an input (/LDAC) for transferring DAC settings from serial input latches to output latches, e.g., DAC registers 106. The serial interface and logic 102 is coupled to a serial data bus of n-bit width, e.g., n=1, 2, 3, etc. Configuration and data values may be written to or read from the non-volatile memory 114 and/or the input registers 104. The DAC registers 106 may be loaded from the respective input registers 104. Also the contents of the non-volatile memory 114 may be transferred to the respective input registers 104.

Referring to FIG. 3, depicted is a table of write commands used for address, command and data protocol structures, according to specific example embodiments of this disclosure. The write commands may be used to write the configuration bits, non-volatile memory, and/or input registers. As summarized in the table shown in FIG. 3, the write command types may be defined by using three write command bits (C2, C1, C0), as more fully described hereinafter.

Figure 4:
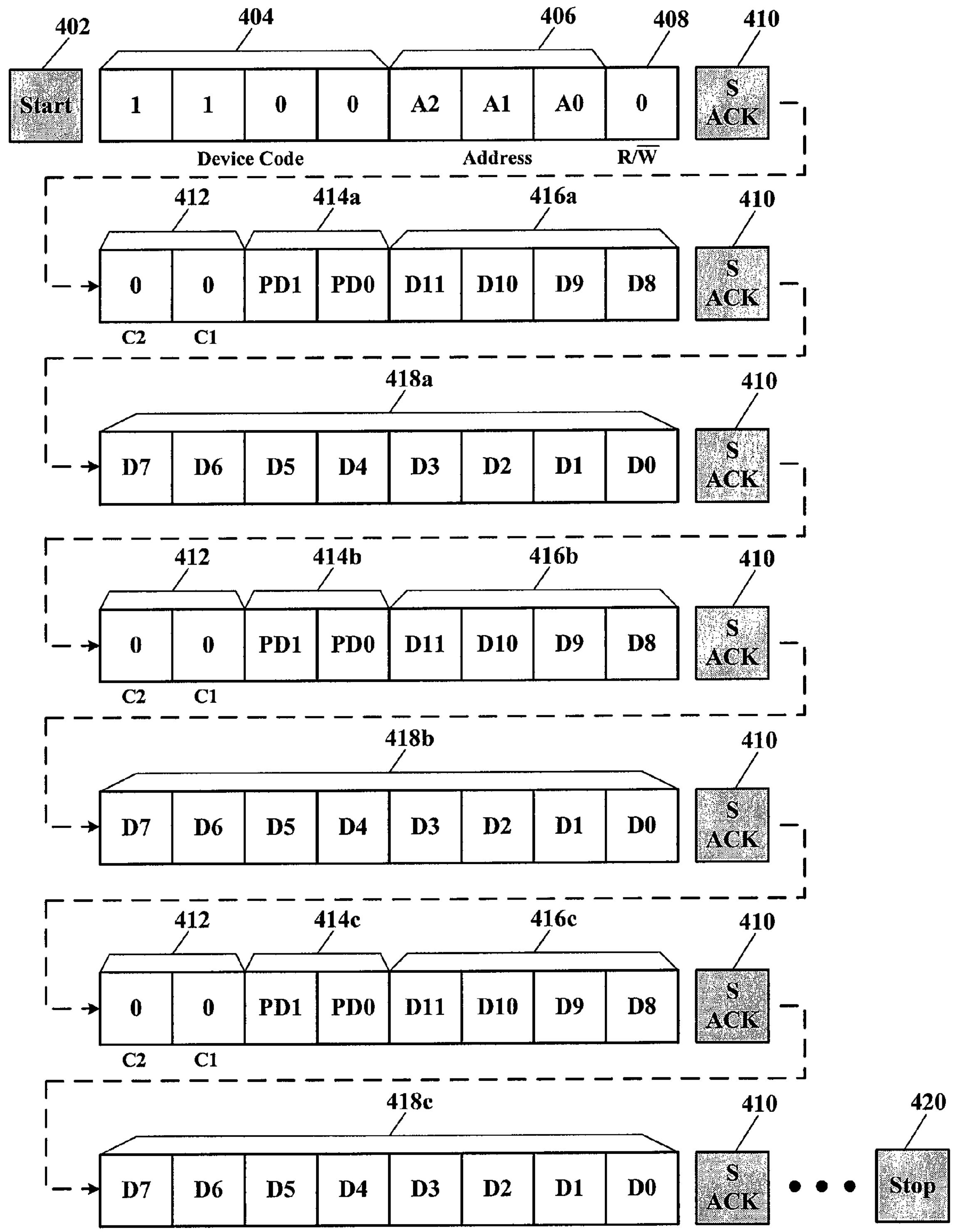
FIG. 4 illustrates a schematic diagram of an address, command and data protocol structure for fast writing only to the DAC input registers (volatile) shown in FIGS. 1 and 2.
Figure 13:
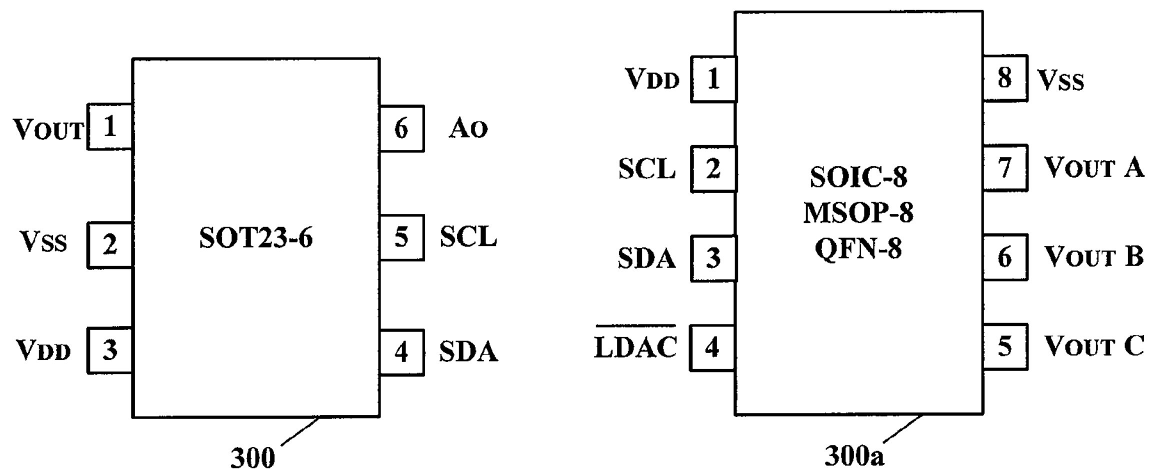
FIG. 13 illustrates schematic plan views of two of many integrated circuit packages that may be used with the devices shown FIGS. 1 and 2, according to specific example embodiments of this disclosure.

Referring to FIG. 4, depicted is a schematic diagram of an address, command and data protocol structure for fast writing only to the input register(s) (volatile) shown in FIGS. 1 and 2. The devices 100 and 200 may support, for example but are not limited to, 7-bit slave addressing. The slave address may contain a device code 404 comprising four fixed identification bits (e.g., 1100*b*) and three address 406 bits (A2, A1, A0) used to select one of a plurality of devices 100 or 200. The device code 404 may be preprogrammed during manufacture, and address 406 may have the A2 and A1 bits hard wired during manufacture and the binary value of the A0 bit determined by the logic level at the A0 package connection (FIG. 13).

The fast write command shown in FIG. 4 begins with a start bit 402 followed by a plurality of bytes (8 bits each), each byte followed by a device (slave) acknowledge 410, and terminates with a stop bit 420. Only the write command bits 412 (C2=0 and C1=0) are used, the C0 bit is ignored C0=X (where X is a don't care). The fast write command is used to sequentially update the input register(s) 104. The power down selection bits (PD1, PD0) 414 and the 12 bits of DAC input data (D11-D0) 416 and 418 are sequentially updated for each DAC channel (bytes for three DAC channels are shown in FIG. 4). Data in the non-volatile memory 114 is not affected by the fast write command.

Figure 5:
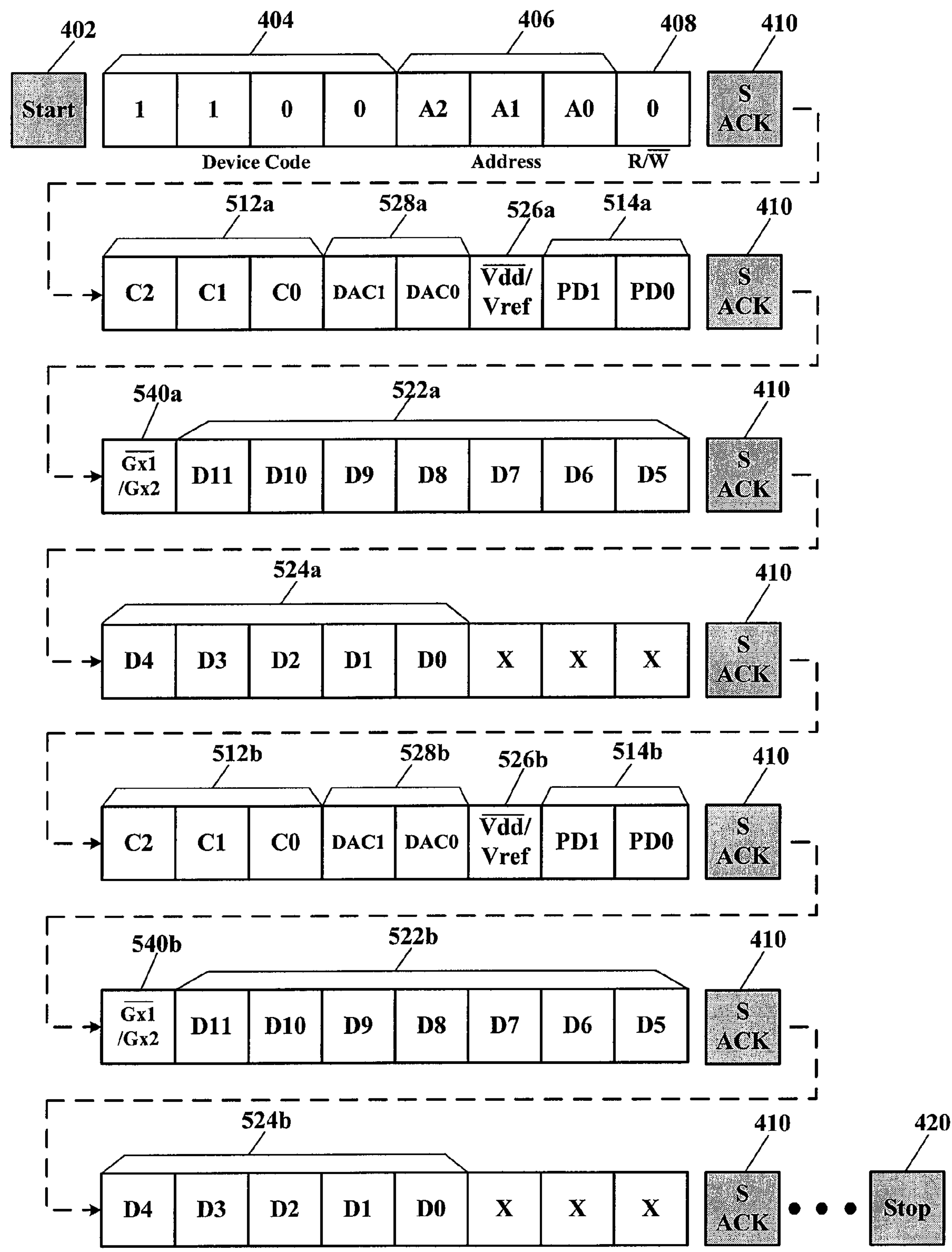
FIG. 5 illustrates a schematic diagram of an address, command and data protocol structure for writing to the DAC input registers and the non-volatile memories shown in FIGS. 1 and 2.

Referring to FIG. 5, depicted is a schematic diagram of an address, command and data protocol structure for writing to the DAC input registers and the non-volatile memories shown in FIGS. 1 and 2. The devices 100 and 200 may support, for example but are not limited to, 7-bit slave addressing. The slave address may contain a device code 404 comprising four fixed identification bits (e.g., 1100*b*) and three address bits 406 (A2, A1, A0) used to select one of a plurality of devices 100 or 200. The device code 404 may be preprogrammed during manufacture, and address 406 may have the A2 and A1 bits hard wired during manufacture and the binary value of the A0 bit determined by the logic level at the A0 package connection (FIG. 13).

The write command protocol shown in FIG. 5 begins with a start bit 402, followed by a plurality of bytes (8 bits each), each byte followed by a device (slave) acknowledge 410, and terminates with a stop bit 420. A first byte comprises a device code 404, a device address 406 (A2, A1, A0) and a read/write bit 408 set to zero. A second byte comprises the three write command bits 512*a* (C2=0, C1=1, C0=0), DAC selection 528*a* (DAC1, DAC0), reference voltage selection bit 526*a*, and power down selection bits 514*a* (PD1, PD0). A third byte comprises a DAC gain selection bit 540*a* (/Gx1/Gx2) and the most significant data bits 522*a* (D11:D5). A fourth byte comprises the least significant data bits 524*a* (D4:D0) with the least significant three bits of the fourth byte ignored as don't cares=X.

The information contained in the second, third and fourth bytes described above may be repeated for each DAC channel. Write command protocols for two instances of DAC channels are shown, however, write protocols for any number of DAC channels are contemplated herein (e.g., FIG. 2) and/or repeated for each one of the DAC channels until the stop bit 420 terminates the write command protocol.

Figure 6:
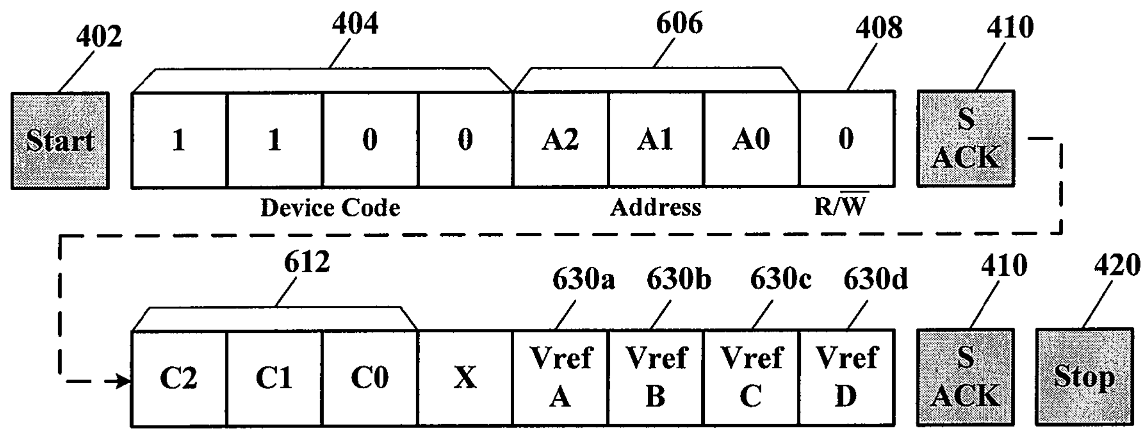
FIG. 6 illustrates a schematic diagram of an address, command and data protocol structure for writing to Vref select bits in the DAC input registers shown in FIGS. 1 and 2.

Referring to FIG. 6, depicted is a schematic diagram of an address, command and data protocol structure for writing to Vref select bits in the DAC input registers shown in FIGS. 1 and 2. The Vref select bits are used to select the voltage reference source used by each of the DACs 108. A first byte comprises device code 404, address bits 406, and read/write bit 608 as described hereinabove. A second byte comprises three write command bits 612 (C2=1, C1=0, C0=0), and Vref select bits 630 for respective ones of the DACs 108 (Vref select bits 630*a*, 630*b*, 630*c* and 630*d* are shown in FIG. 6 for four DACs). A single Vref select bit 630 per DAC 108 allows for two reference voltage sources, e.g., an internally generated reference voltage or a power supply voltage, Vdd. This write command terminates with a stop bit 420.

Figure 7:
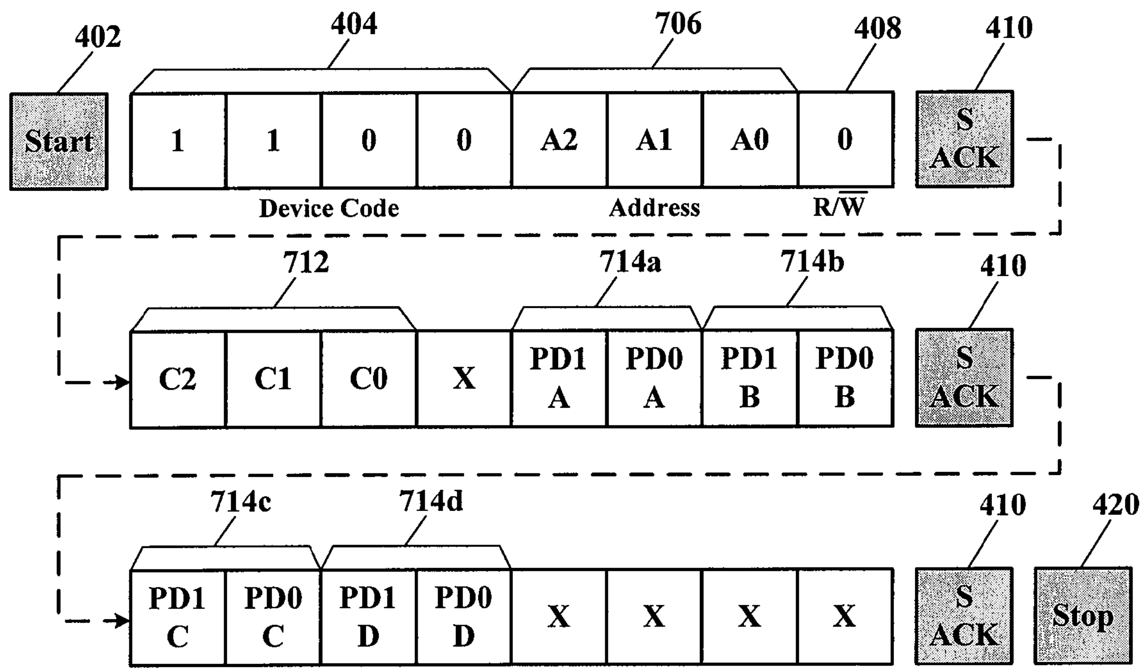
FIG. 7 illustrates a schematic diagram of an address, command and data protocol structure for writing to power-down select bits in the DAC input registers shown in FIGS. 1 and 2.

Referring to FIG. 7, depicted is a schematic diagram of an address, command and data protocol structure for writing to power-down select bits in the DAC input registers shown in FIGS. 1 and 2. This write command is used to select either a normal or power down mode for each of the DACs 108. Two power-down bits 714 (PD1, PD0) are used for each of the DACs 108. When a normal mode is selected for a DAC 108, that DAC 108 will output an analog voltage. When a power down mode is selected, there will be no analog voltage output from the associated DAC 108, instead a fixed resistance value to ground or common will be substituted depending upon the logic values of the two power-down bits 714 (PD1, PD0). A first byte comprises device code 404, address bits 706, and read/write bit 408 as described hereinabove. A second byte comprises three write command bits 712 (C2=1, C1=0, C0=1), and power-down bit pairs 714 for respective ones of the DACs 108 (four pairs of power-down bits 714*a*, 714*b*, 714*c* and 714*c* for four DACs 108 are shown in FIG. 7). This write command terminates with a stop bit 420.

Figure 8:
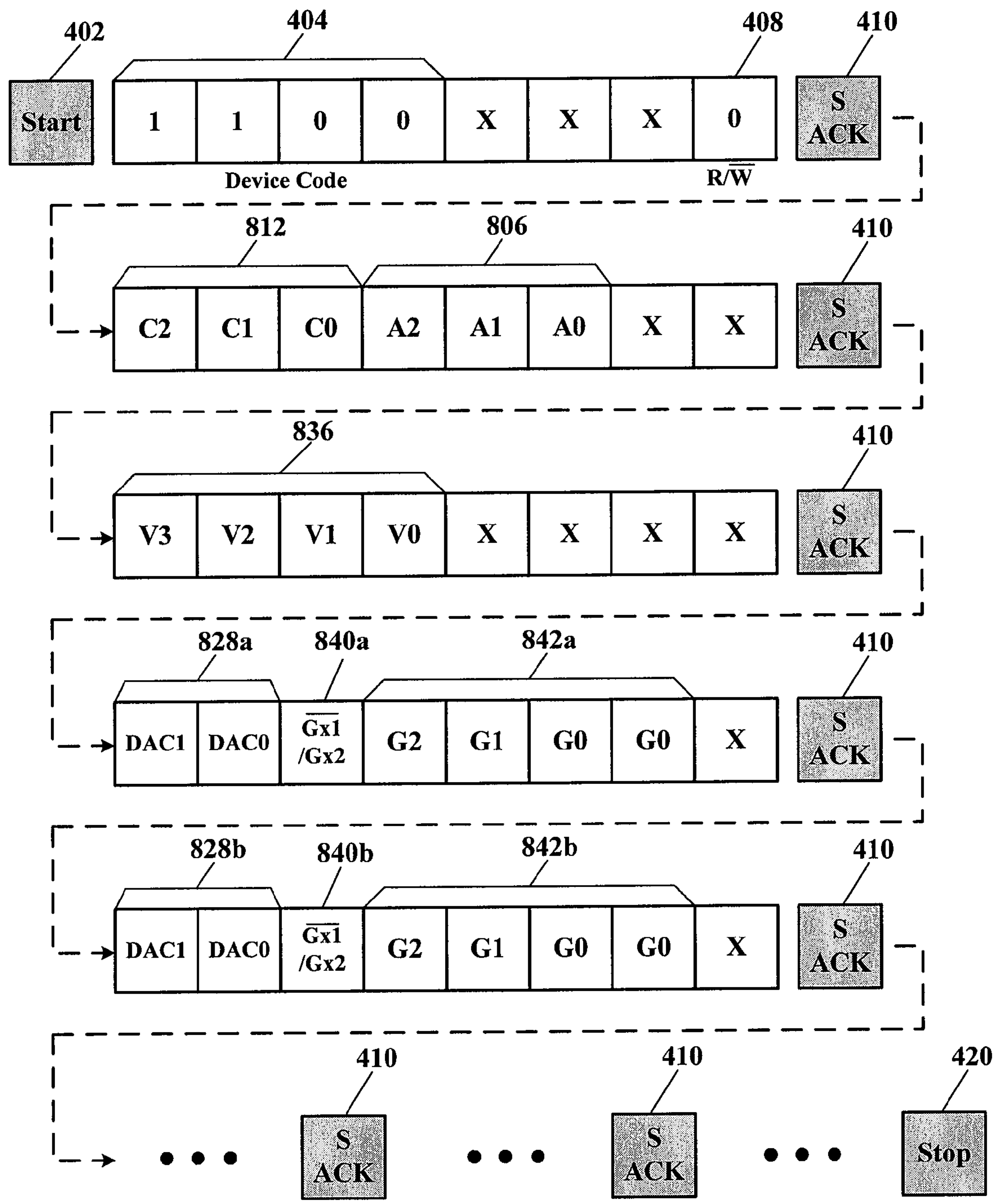
FIG. 8 illustrates a schematic diagram of an address, command and data protocol structure for writing to trim and address bits in the non-volatile memories of the DAC devices shown in FIGS. 1 and 2.

Referring to FIG. 8, depicted is a schematic diagram of an address, command and data protocol structure for writing to trim and address bits in the non-volatile memories of the DAC devices shown in FIGS. 1 and 2. Typically this command is used when the device 100 is in a test mode. A first byte comprises device code 404 and read/write bit 408 as described hereinabove. A second byte comprises three write command bits 812 (C2=1, C1=0, C0=1), and address bits 806. The third byte comprises voltage reference trim bits 836 used to adjust the internal voltage reference (not shown). The fourth byte comprises DAC selection bits 828, a DAC gain selection bit 840 for the selected DAC from the selection bits 828, and trim bits 842 for trimming the operational amplifier 112 of the selected DAC 108. Fifth, sixth and seventh bytes may repeat the configuration of the fourth byte, one for each DAC 108 selected, e.g., selection of four DACs with four bytes, (byte five shown in FIG. 8 for a second selected DAC 108. This test mode write command terminates with a stop bit 420.

Figure 9:
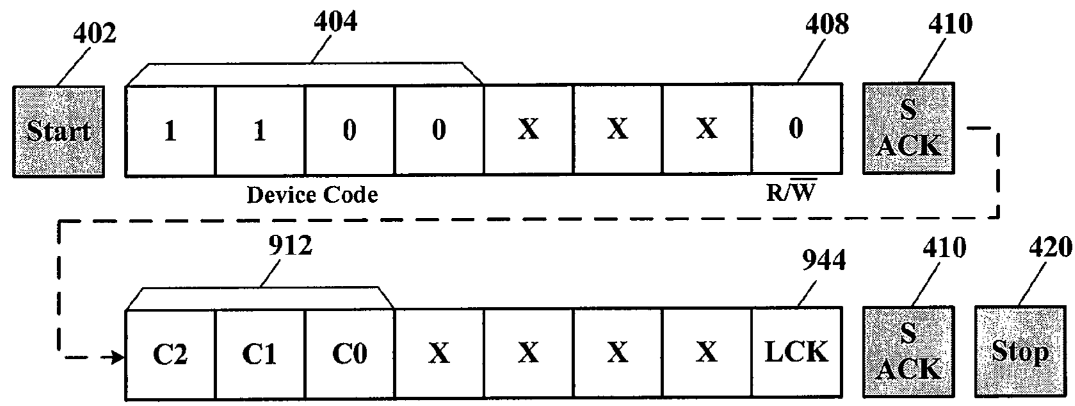
FIG. 9 illustrates a schematic diagram of an address, command and data protocol structure for writing to a lock bit in the non-volatile memories of the DAC devices shown in FIGS. 1 and 2.

Referring to FIG. 9, depicted is a schematic diagram of an address, command and data protocol structure for writing to a lock bit in the non-volatile memories of the DAC devices shown in FIGS. 1 and 2. Typically this command is used when the device 100 is in a test mode. A first byte comprises device code 404 and read/write bit 408 as described hereinabove. A second byte comprises three write command bits 912 (C2=1, C1=1, C0=0), and lock bit 944. The lock bit prevents unauthorized modification of the contents of the non-volatile memories 114 of the DAC devices 100 and 200. A write command in test mode is only executed when the lock bit 944 is cleared (logic 0). This test mode write command terminates with a stop bit 420.

Figure 10A:
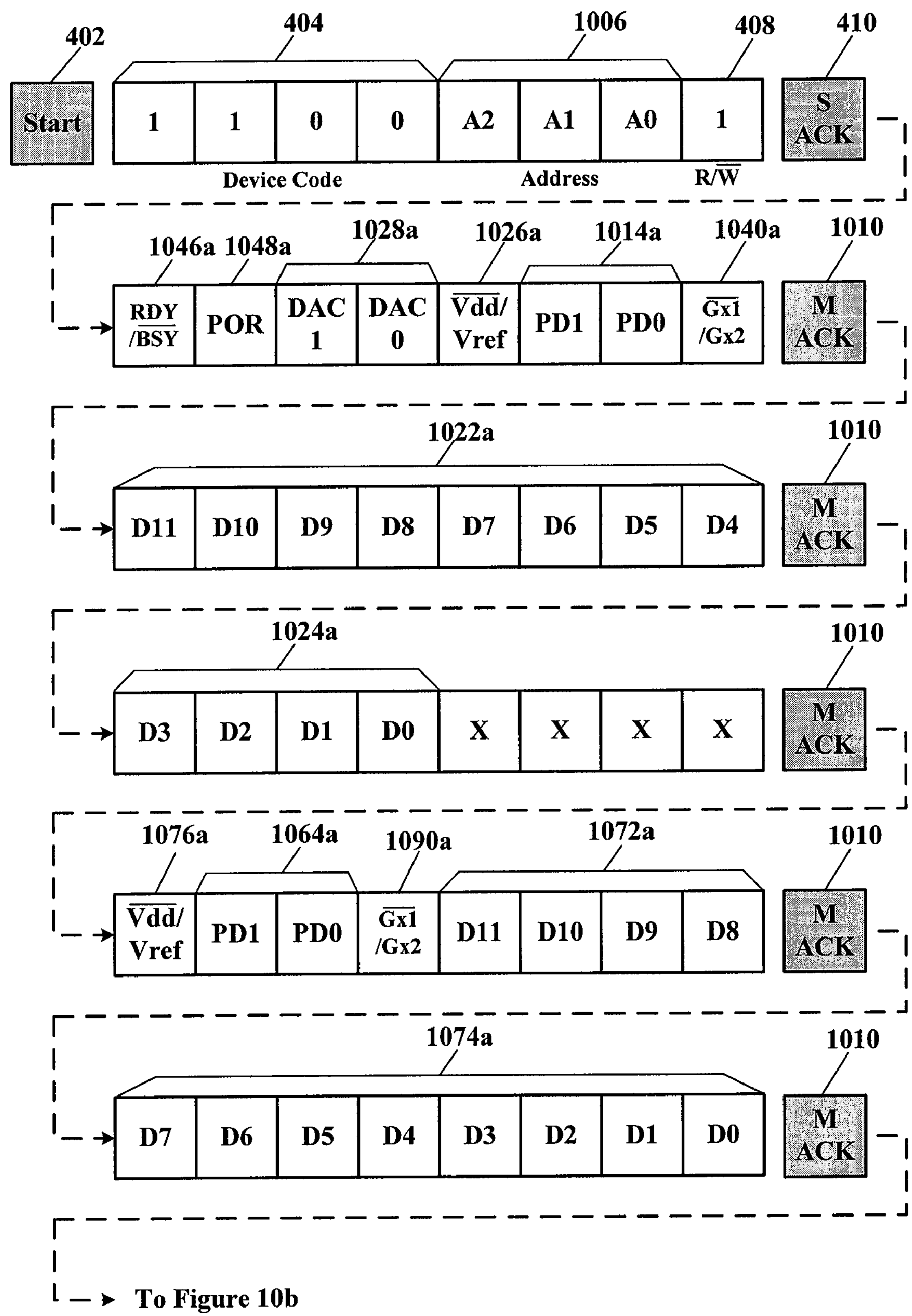
FIGS. 10*a*-10*d* illustrate a schematic diagram of an address, command and data protocol structure for reading in normal mode the DAC input registers and non-volatile memories of the DAC devices shown in FIGS. 1 and 2.

Referring to FIGS. 10*a*-10*d*, depicted is a schematic diagram of an address, command and data protocol structure for reading in normal mode the DAC input registers and non-volatile memories of the DAC devices shown in FIGS. 1 and 2. Referring now to FIG. 10*a*, the read command in normal mode begins with a start bit 402 followed by a first byte sent by the $I^2C$ bus master, e.g., a digital processor (not shown), wherein the first byte comprises a device code 404, address bits 1006, and a read/write bit 408 (set to logic 1 indicating a read operation). Once the first byte of this read command from the I$^2$C bus master is finished, a slave acknowledge 410 is asserted.

Then the addressed slave device, e.g., device 100 or 200, sends a second byte comprising the present status of the data contents contained in the DAC register 106 of DAC channel A (FIG. 2), this byte comprises a ready/busy bit 1046*a* that indicates the completion status of a write to the nonvolatile memory 114 (e.g., logic 1 indicates write complete, logic 0 indicates otherwise); and the indicated DAC channel 1028*a* (i.e., DAC1, DAC0) present status of its power-on-reset bit 1048*a*, DAC selection bits 1028*a* (indicates for which DAC 108 the information is being read), reference voltage selection bit 1026*a*, power down selection bits 1014*a* (PD1, PD0), and a DAC gain selection bit 1040*a* (/Gx1/Gx2). After the second byte has been read by the I$^2$C bus master, the bus master sends a master acknowledge 1010. A third byte is then sent by the slave device, the third byte comprises the eight (8) most significant bits of data 1022*a* contained in the DAC register 106 associated with the DAC selection bits 1028*a*. After the third byte has been read by the I$^2$C bus master, the bus master sends another master acknowledge 1010. A fourth byte is then sent by the slave device, the fourth byte comprises the least significant 4 bits of data contained in the DAC register 106 associated with the DAC indicated in the selection bits 1028*a*. After the fourth byte has been read by the I$^2$C bus master, the bus master sends another master acknowledge 1010.

Then the addressed slave device, e.g., device 100 or 200, sends a fifth byte comprising the present status of the data contents contained in the non-volatile memory 114, this byte comprises a reference voltage selection bit 1076*a*, power down selection bits 1064*a* (PD1, PD0), a DAC gain selection bit 1090*a* (/Gx1/Gx2), and the four (4) most significant bits of data 1072*a* contained in the non-volatile memory 114 associated with the DAC selection bits 1028*a*. After the fifth byte has been read by the I$^2$C bus master, the bus master sends a master acknowledge 1010. A sixth byte is then sent by the slave device, the sixth byte comprises the least significant eight (8) bits of data 1074*a* contained in the non-volatile memory 114 associated with the DAC selection bits 1028*a*. After the sixth byte has been read by the I$^2$C bus master, the bus master sends another master acknowledge 1010.

Figure 10B:
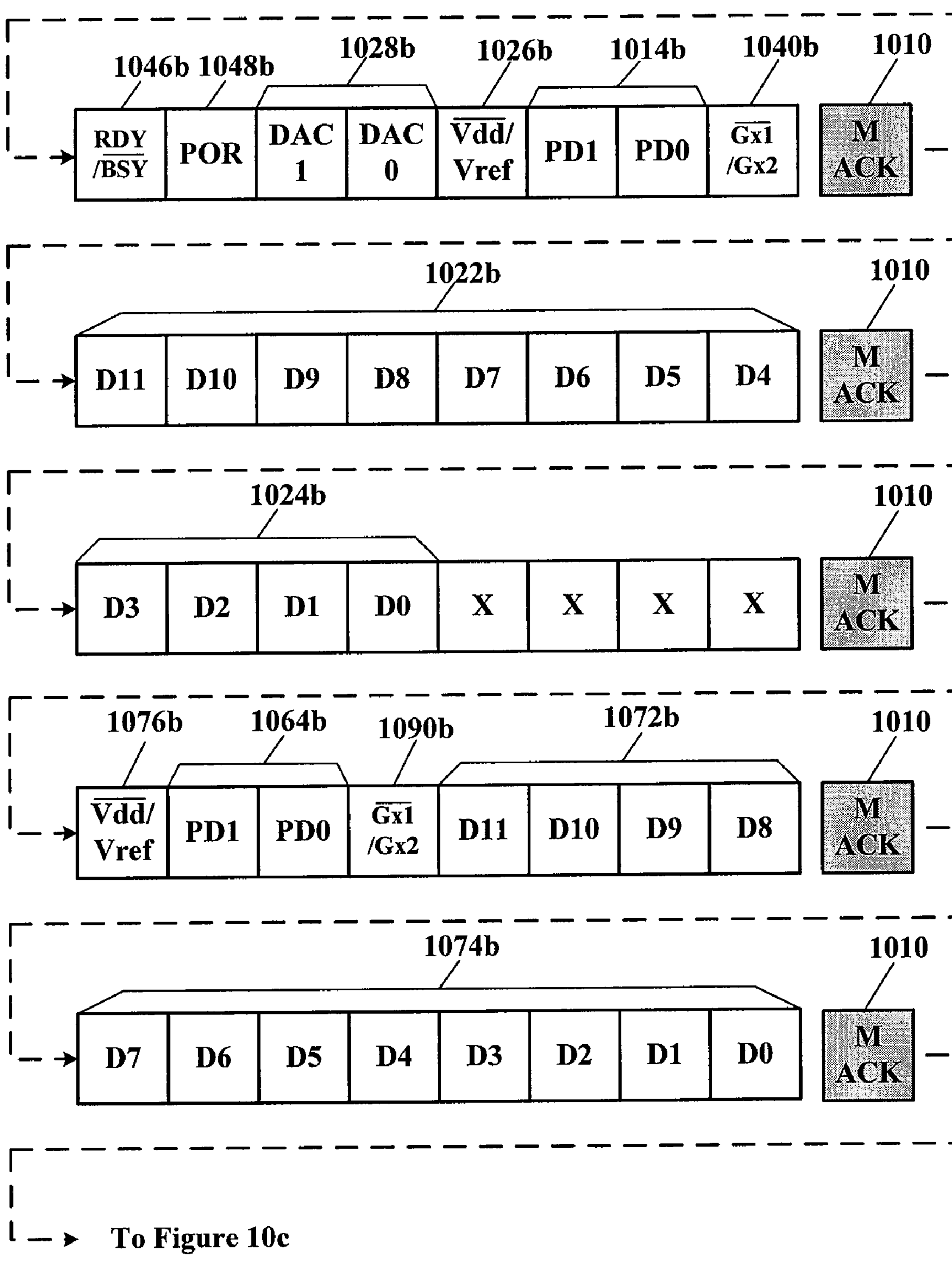
Figure 10C:
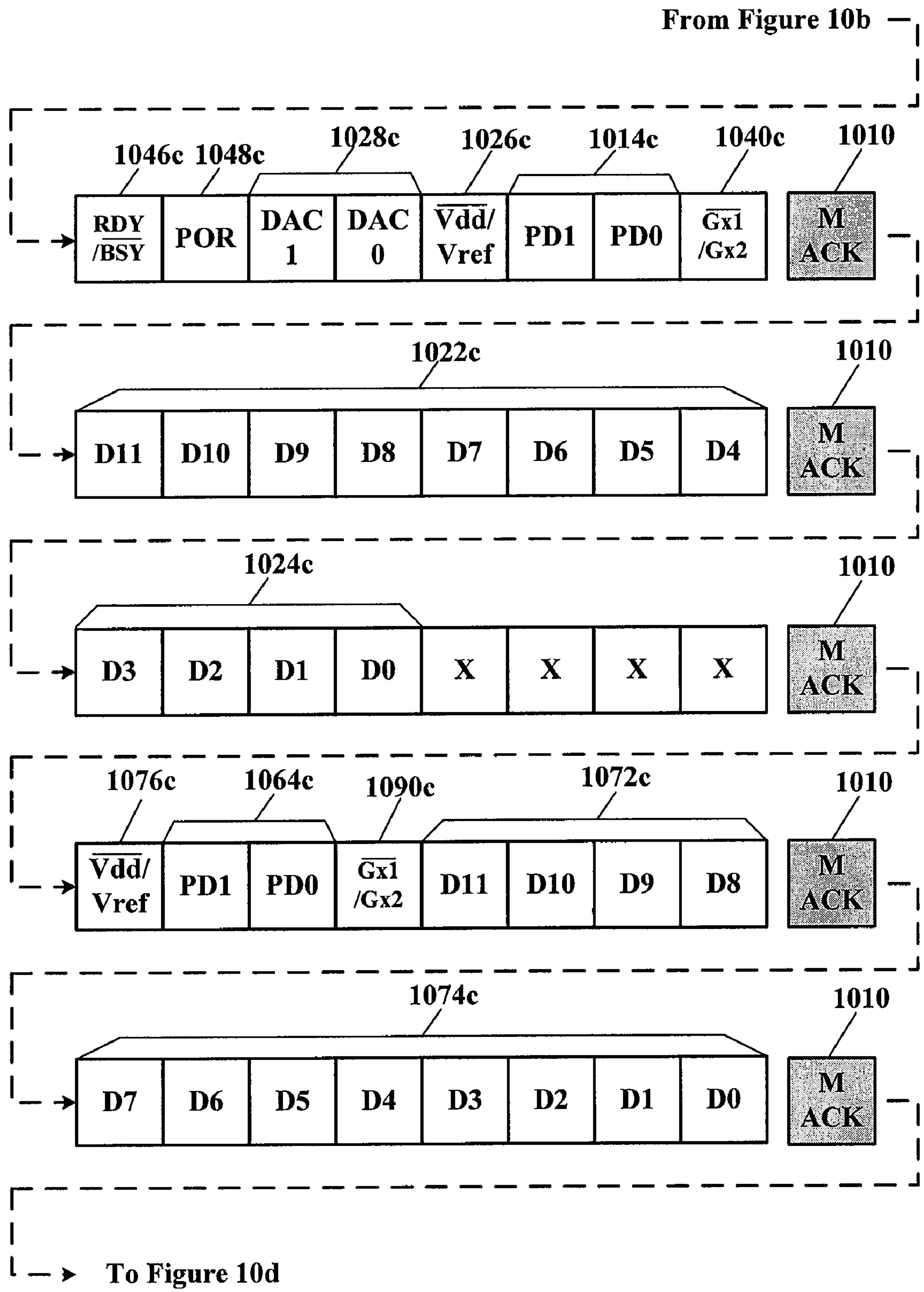
Figure 10D:
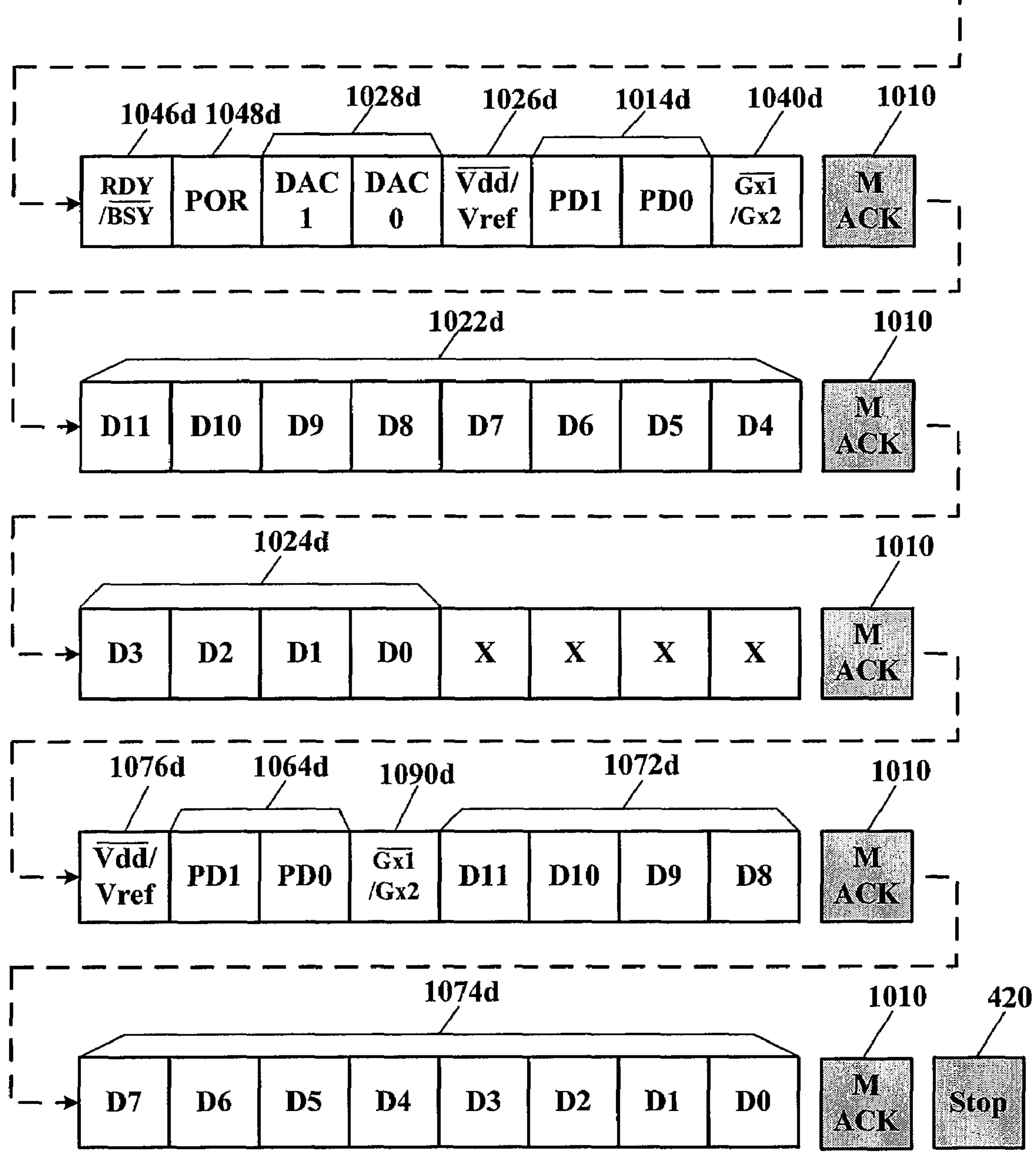

FIG. 10*b* shows bytes seven (7) through eleven (11) that may be used to supply all of the previously mentioned respective status and data for the next DAC channel B (FIG. 2). FIG. 10*c* shows bytes twelve (12) through sixteen (16) that may be used to supply all of the previously mentioned respective status and data for the next DAC channel C (FIG. 2). FIG. 10*d* shows bytes seventeen (17) through twenty-one (21) that may be used to supply all of the previously mentioned respective status and data for the next DAC channel D (FIG. 2). This reading in normal mode command will terminate with a stop bit 420.

Figure 11A:
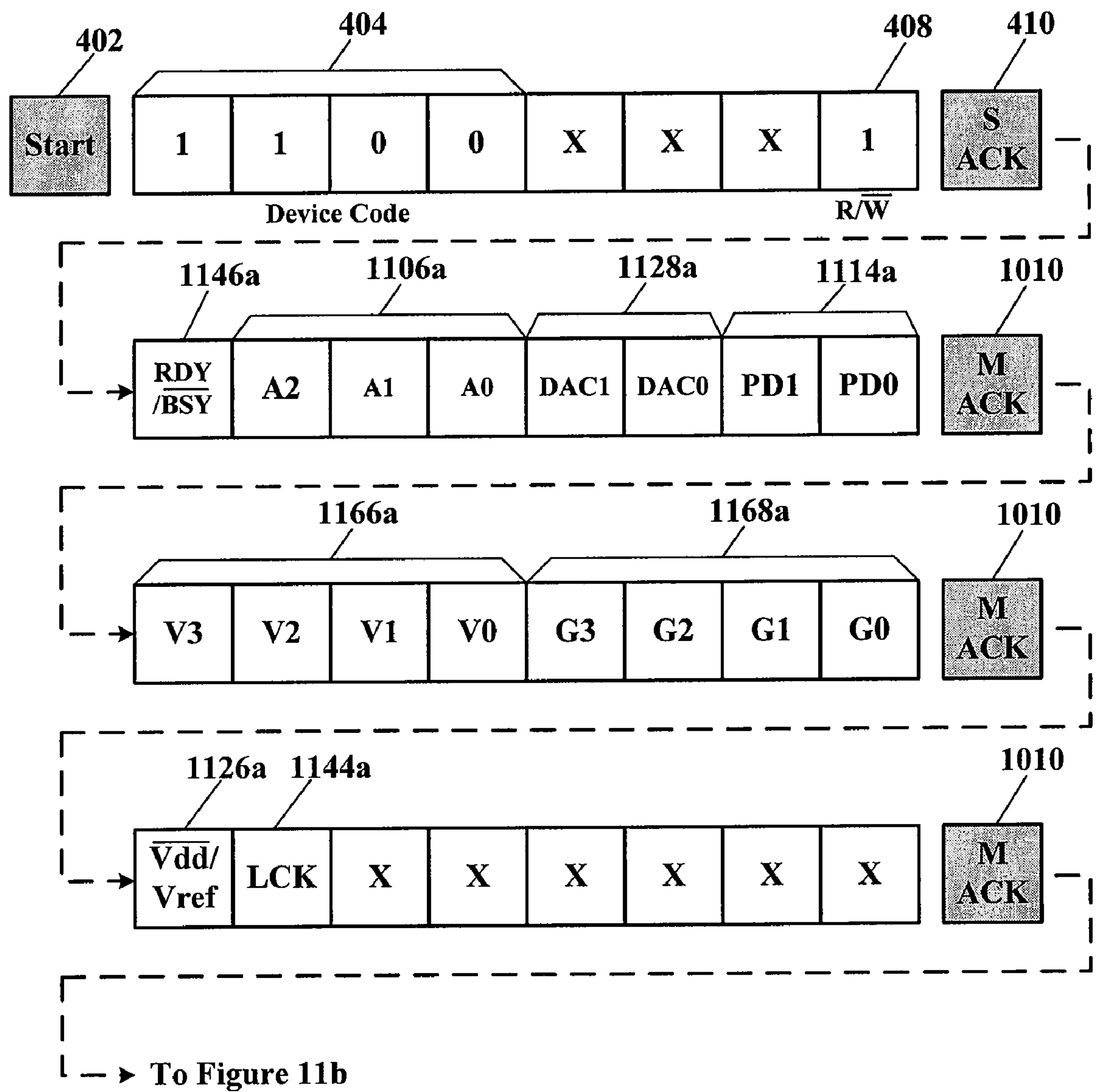
FIGS. 11*a*-11*d* illustrate a schematic diagram of an address, command and data protocol structure for reading in test mode the DAC input registers and non-volatile memories of the DAC devices shown in FIGS. 1 and 2.

Referring to FIGS. 11*a*-11*d*, depicted is a schematic diagram of an address, command and data protocol structure for reading in test mode the DAC input registers and non-volatile memories of the DAC devices shown in FIGS. 1 and 2. A high voltage may be applied to the /LDAC pin of device 200 (FIG. 2) before and during execution of the test mode read command. Referring now to FIG. 11*a*, the read command in test mode begins with a start bit 402 followed by a first byte sent by the I$^2$C bus master, e.g., a digital processor (not shown), wherein the first byte comprises a device code 404, and a read/write bit 408 (set to logic 1 indicating a read operation). Once the first byte of this read command from the I$^2$C bus master is finished, a slave acknowledge 410 is asserted by the slave device under test.

Then the second byte is sent by the slave device under test, wherein the second byte comprises a ready/busy bit 1146*a* that indicates the completion status of a write to the nonvolatile memory 114 (e.g., logic 1 indicates write complete, logic 0 indicates otherwise), the address 1106*a* of the slave device under test (A2, A1, A0), the DAC channel selected indicated by the DAC selection bits 1128*a* (DAC1, DAC0), and the status of the power down selection bits 1014*a* (PD1, PD0) of the selected DAC channel. After the second byte has been read by the bus master, the bus master sends a master acknowledge 1010.

A third byte is then sent by the slave device under test, wherein the third byte comprises the status of the voltage reference trim bits 1166*a* (V3, V2, V1, V0), and the status of the gain trim bits 1168*a* ((G3, G2, G1, G0) of the selected DAC channel, e.g., channel A (FIG. 2). After the third byte has been read by the bus master, the bus master sends a master acknowledge 1010.

A fourth byte is then sent by the slave device under test, wherein the fourth byte comprises the status of the reference voltage selection bit 1026*a* and the status of the lock bit 1144*a* of the selected DAC channel. After the fourth byte has been read by the bus master, the bus master sends a master acknowledge 1010.

Figure 11B:
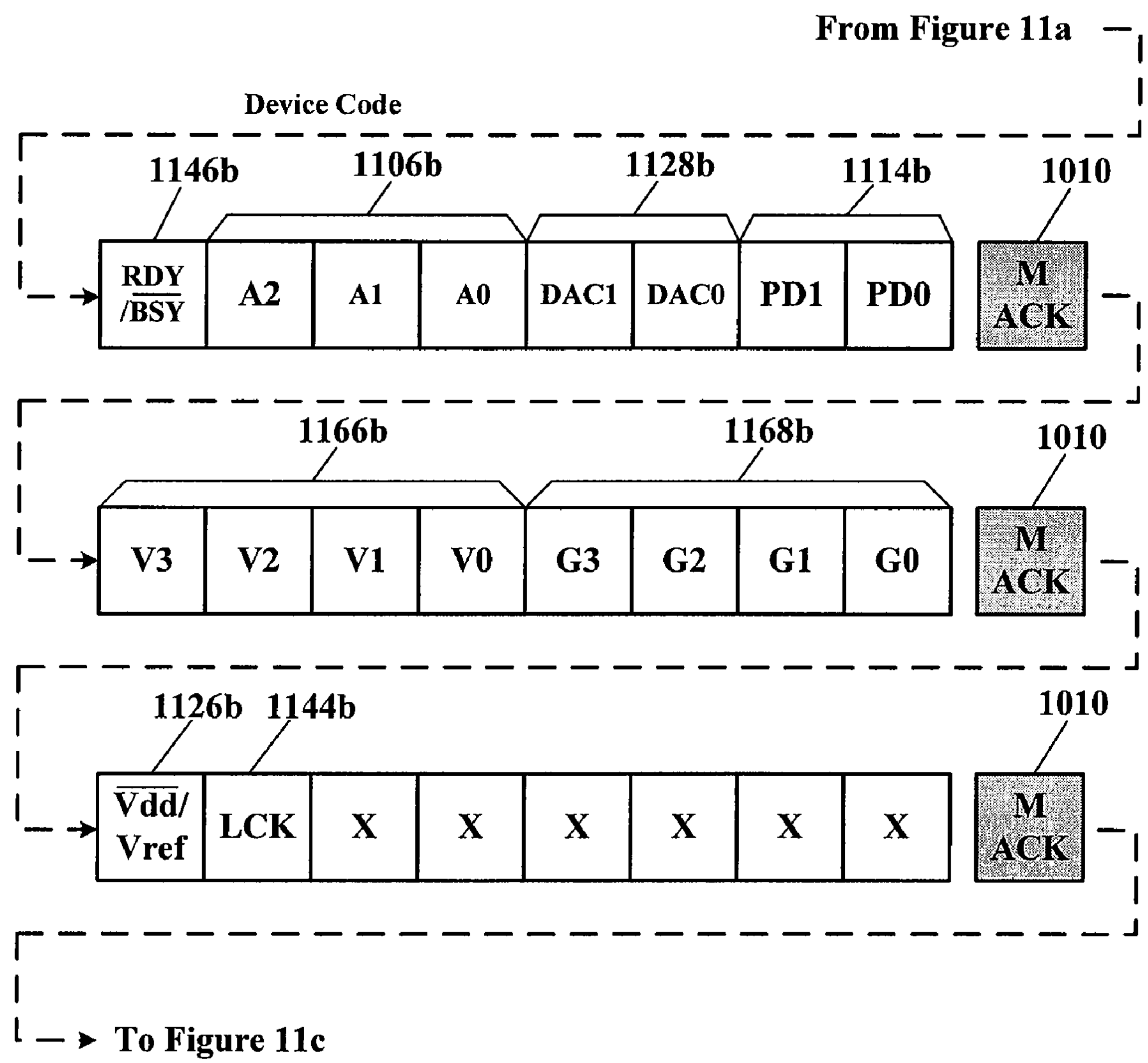
Figure 11C:
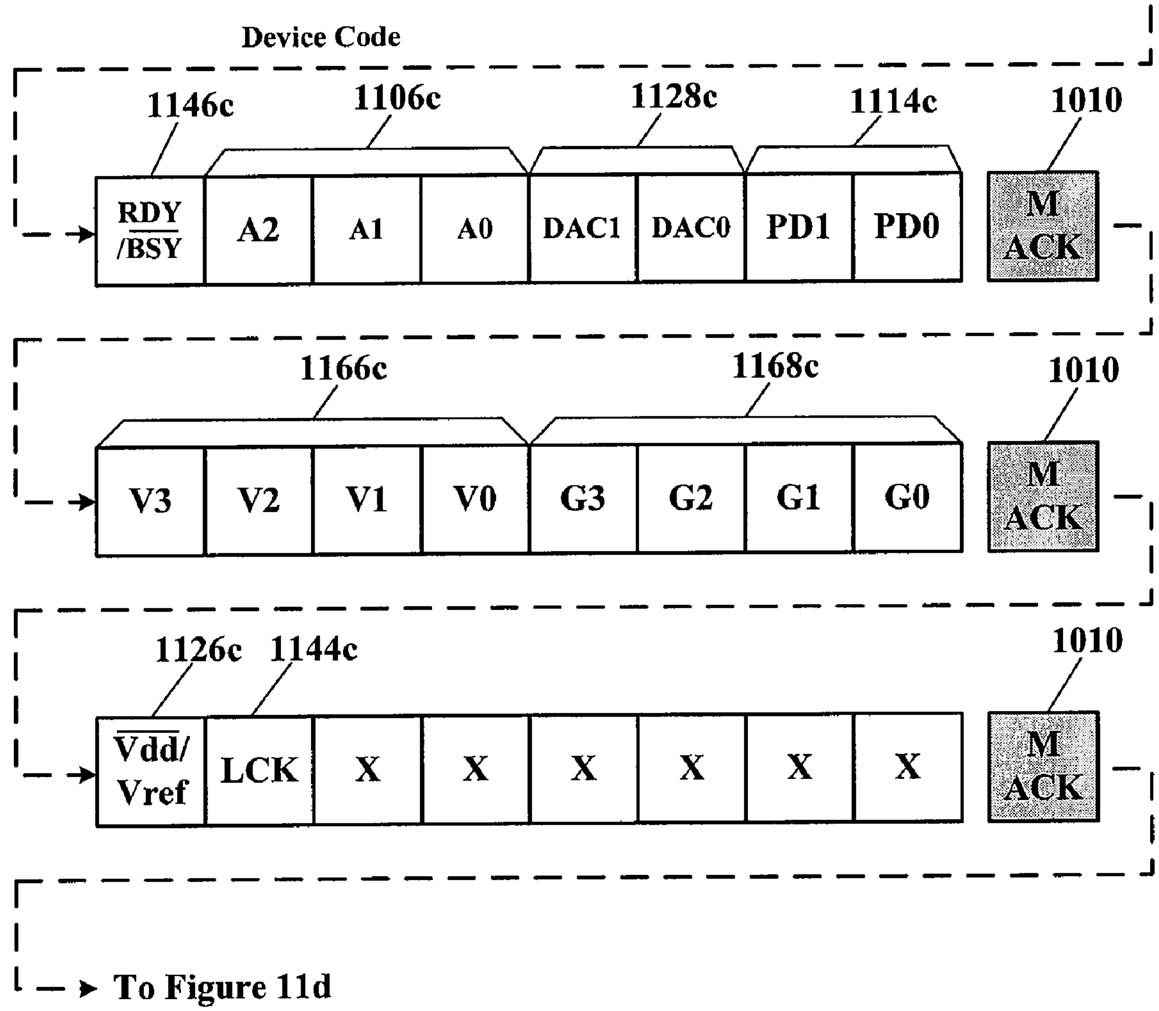
Figure 11D:
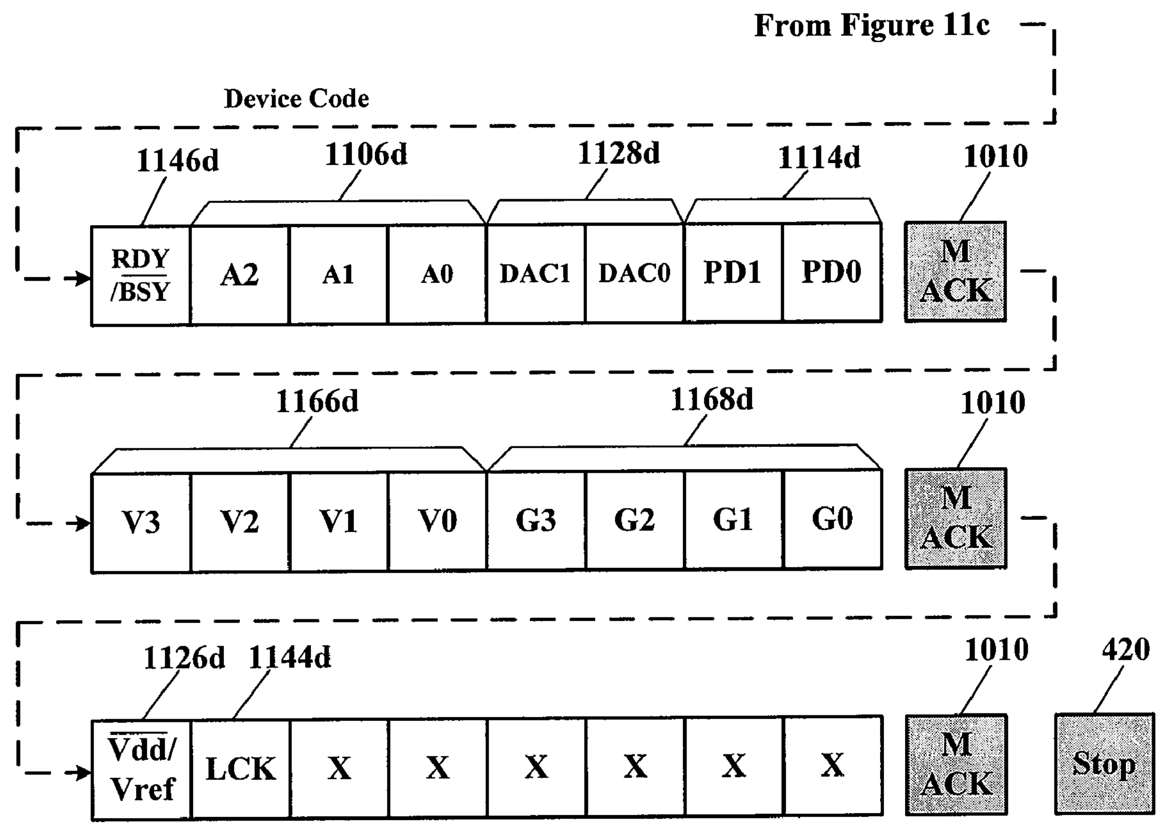

FIG. 11*b* shows bytes five (5) through seven (7) that may be used to supply all of the previously mentioned status information for the next DAC channel B (FIG. 2). FIG. 11*c* shows bytes eight (8) through ten (10) that may be used to supply all of the previously mentioned status information for the next DAC channel C (FIG. 2). FIG. 11*d* shows bytes eleven (11) through thirteen (13) that may be used to supply all of the previously mentioned status information for the next DAC channel D (FIG. 2). This reading in test mode command will terminate with a stop bit 420.

Figure 12:
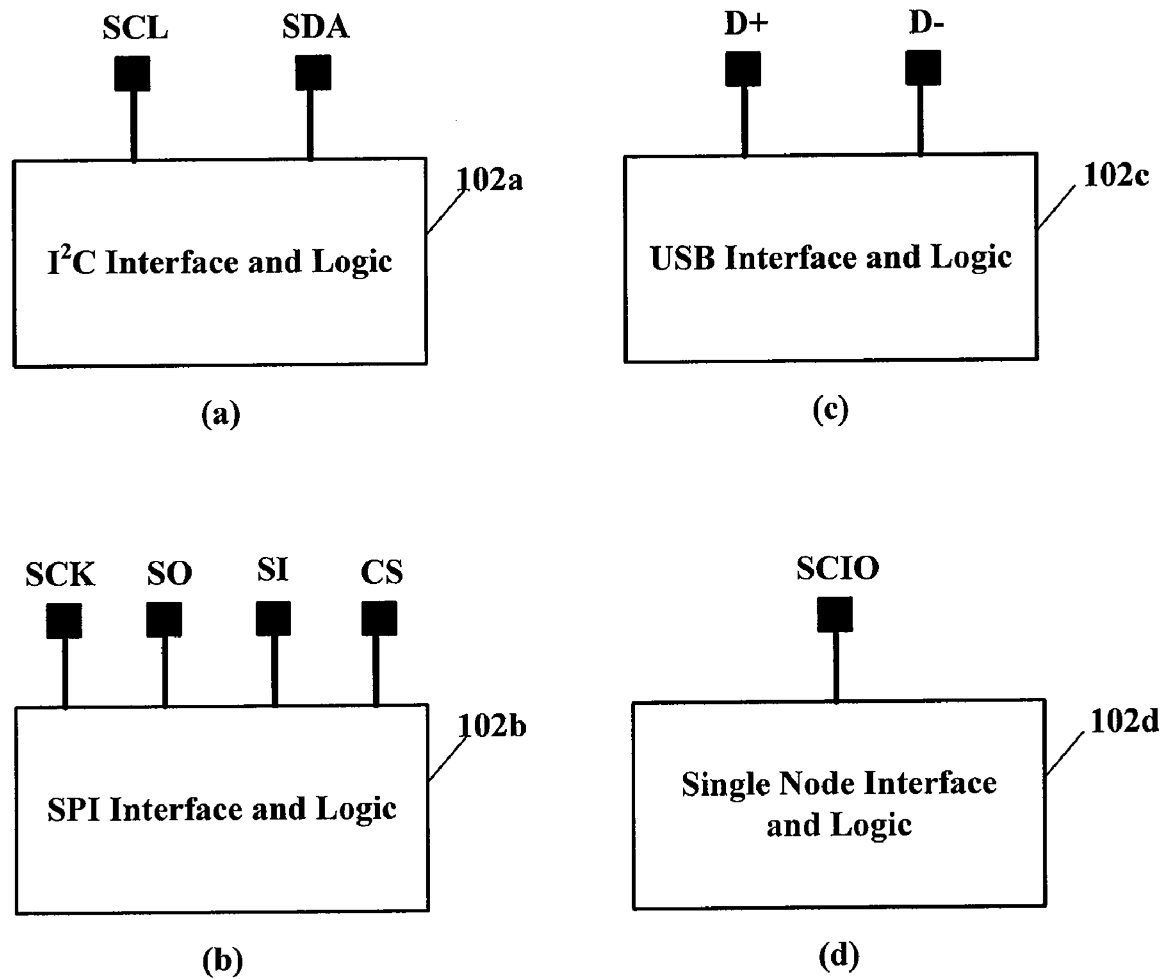
FIGS. 12(*a*), 12(*b*), 12(*c*) and 12(*d*) illustrate schematic block and bus signal diagrams of various types of serial interfaces that may be used with the devices shown FIGS. 1 and 2, according to specific example embodiments of this disclosure.

Referring to FIGS. 12(*a*), 12(*b*), 12(*c*) and 12(*d*), depicted are schematic block and bus signal diagrams of various types of serial interfaces that may be used with the device shown FIGS. 1 and 2, according to specific example embodiments of this disclosure. As shown in FIG. 2(*a*), an I$^2$C interface and logic 102*a* has a serial clock line, SCL, and a serial data line, SDA. The I$^2$C interface specification is available from Phillips Semiconductors and is hereby incorporated herein for all purposes. As shown in FIG. 2(*b*), a serial peripheral interface (SPI) and logic 102*b* has a serial clock, SCK, a data out line, SI, a data in line, SO, and a chip select, CS. The SPI interface specification is available from Motorola, Inc., or from any device manufacture incorporating the SPI interface in their products. The SPI interface specification is hereby incorporated herein for all purposes. As shown in FIG. 2(*c*), a Universal Serial Bus (USB) and logic 102*c* has self clocking data lines D+ and D−. The USB interface specification is available at www.usb.org, or from any device manufacture incorporating the USB interface in their products. The USB interface specification is hereby incorporated herein for all purposes. As shown in FIG. 2(*d*), a Serial Clock Input-Output (SCIO) and logic 102*d* has a single self clocking data line SCIO. The SCIO interface may use Manchester coding so that the clock and data are conveyed on a single bit line. Other serial interface standards are known to those skilled in digital electronics design and may also be effectively used with the teachings of this disclosure.

Referring to FIG. 13, depicted are schematic plan views of two of many integrated circuit packages that may be used with the devices shown FIGS. 1 and 2, according to specific example embodiments of this disclosure. The $I^2C$ interface is shown, but it is contemplated and within the scope of this disclosure that any integrated circuit package may be used with any serial interface bus and number of analog outputs, device select nodes, A0 , load register synchronization /LDCA, etc. It is contemplated and within the scope of this disclosure that the device select (e.g., enable) may also be done with programmable device select addressing in the serial data.

A serial bus protocol that supports slave addressing may be used to control, and read/write configuration and data from/to the devices 100 and 200. Some of these address bits may be programmed into the devices 100 and or 200 during fabrication at the factory and/or programmed during systems integration or even in the field.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A device for digital-to-analog conversion and having non-volatile memory for storage of configuration information and digital values for conversion to analog values, said device comprising:

- a serial input-output port adapted for coupling to a serial bus;
- a serial interface and logic, the serial interface coupled to the serial input-output port;
- one or more input registers coupled to the serial interface and logic;
- one or more digital-to-analog converter registers coupled to respective ones of the one or more input registers;
- one or more digital-to-analog converters coupled to respective ones of the one or more digital-to-analog converter registers; and
- at least one non-volatile memory coupled to the one or more input registers;
- wherein the serial input-output port receives commands that are coupled to the serial interface and logic, whereby the commands cause the serial interface and logic to control operation, reading and writing of data, and reading status of the device;
- the commands are selected from the group consisting of:
  - a fast write command for writing configuration information and data to the one or more input resisters,
  - a write command for writing configuration information and data to the one or more input resisters and the one or more non-volatile memories,
  - a voltage reference selection command for selecting a voltage reference source for the one or more digital-to-analog converters,
  - a power-down selection command for selecting either a normal or power-down mode for each of the one or more digital-to-analog converters,
  - a first test mode command for writing trim bits for a voltage reference and trim bits for an operational amplifier associated with each of the one or more digital-to-analog converters,
  - a second test command for locking unauthorized modification of the at least one non-volatile memory,
  - a read command for reading configuration information and data in the one or more input registers and the at least one non-volatile memory, and
  - a third test command for reading configuration information for each of the one or more digital-to-analog converters.

2. The device according to claim 1, further comprising a charge pump for supplying a write voltage to the at least one non-volatile memory during a write operation.

3. The device according to claim 1, further comprising power down control logic for controlling the one or more digital-to-analog converters.

4. The device according to claim 1, further comprising one or more analog amplifiers coupled to an analog output of respective ones of the one or more digital-to-analog converters.

5. The device according to claim 4, further comprising power down control logic for controlling the one or more analog amplifiers.

6. The device according to claim 1, further comprising a power-on-reset circuit for resetting the device upon loss of power thereto.

7. The device according to claim 1, further comprising an address select input coupled to the serial interface and logic for selection of an address for the device.

8. The device according to claim 1, wherein each of the one or more digital-to-analog converters is 12 bits.

9. The device according to claim 1, wherein at least one non-volatile memory is electrically erasable and programmable read only memory (EEPROM).

10. The device according to claim 1, wherein at least one non-volatile memory is FLASH memory.

11. The device according to claim 1, wherein the fast write command comprises:

- a device code and an address for selection of the device;
- a read/write selection bit indicating a write operation;
- a fast write command code;
- a power down code; and
- digital input data for the each of one or more input registers.

12. The device according to claim 1, wherein the write command comprises:

- a device code and an address for selection of the device;
- a read/write selection bit indicating a write operation;
- a write command code;
- a selection code for each of the one or more digital-to-analog converters;
- a voltage reference selection code for each of the one or more digital-to-analog converters;
- a power down code for each of the one or more digital-to-analog converters;
- a gain selection code for each of the one or more digital-to-analog converters; and
- digital input data for each of the one or more digital-to-analog converters.

13. The device according to claim 1, wherein the voltage reference selection command comprises:

- a device code and an address for selection of the device;
- a read/write selection bit indicating a write operation;
- a voltage reference selection command code; and
- a voltage reference code for each of the one or more digital-to-analog converters.

14. The device according to claim 1, wherein the power-down selection command comprises:

- a device code and an address for selection of the device;
- a read/write selection bit indicating a write operation;
- a power-down selection command code; and a power-down code for each of the one or more digital-to-analog converters.

15. The device according to claim 1, wherein the first test mode command comprises:

a device code and an address for selection of the device;

a read/write selection bit indicating a write operation;

a trim command code;

voltage reference trim bits;

selection bits for each of the one or more digital-to-analog converters;

a gain selection bit for each of the one or more digital-to-analog converters; and trim bits for trimming each of the one or more digital-to-analog converters.

16. The device according to claim 1, wherein the second test command comprises:

a device code for selection of the device;

a read/write selection bit indicating a write operation;

a lock command code; and a lock bit for preventing unauthorized modification of the at least one non-volatile memory.

17. The device according to claim 1, wherein the read command comprises:

a device code and an address for selection of the device;

a read/write selection bit indicating a read operation;

a ready/busy bit indicating completion status of a write operation to the at least one non-volatile memory associated with each of the one or more digital-to-analog converters;

a power-on-reset bit indicating the power-on-reset status for each of the one or more digital-to-analog converters;

identification of each of the one or more digital-to-analog converters so as to indicate their respective operating parameters stored in the respective one or more digital-to-analog converter registers for voltage reference selection, power-down selection, gain selection, and a data word value used for determining an analog output thereof; and to indicate their respective operating parameters stored in the at least one non-volatile memory for voltage reference selection, power-down selection, gain selection, and a data word value used for determining an analog output thereof.

18. The device according to claim 1, wherein the third test command comprises:

a device code and an address for selection of the device;

a read/write selection bit indicating a read operation;

a ready/busy bit indicating completion status of a write operation to the at least one non-volatile memory associated with each of the one or more digital-to-analog converters;

identification of the device under test;

identification of each of the one or more digital-to-analog converters so as to indicate their respective configuration information for power-down selection, voltage reference trim values, gain trim values, voltage reference selection, and lock bit status.

* * * * *